United States Patent
Wilkie et al.

(10) Patent No.: US 12,072,367 B2
(45) Date of Patent: *Aug. 27, 2024

(54) HYBRID SWITCH FOR SUBSTATION AND OTHER APPLICATIONS AND METHODS OF OPERATING SAME

(71) Applicant: Eaton Intelligent Power Limited, Dulin (IE)

(72) Inventors: Eddie Wilkie, Fletcher, NC (US); Geraldo Nojima, Fort Mill, SC (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 18/342,334

(22) Filed: Jun. 27, 2023

(65) Prior Publication Data
US 2023/0341452 A1 Oct. 26, 2023

Related U.S. Application Data

(63) Continuation of application No. 17/003,594, filed on Aug. 26, 2020, now Pat. No. 11,726,130.

(51) Int. Cl.
*G01R 31/08* (2020.01)
*H02H 9/00* (2006.01)
(Continued)

(52) U.S. Cl.
CPC .......... *G01R 31/086* (2013.01); *H02H 9/001* (2013.01); *H02H 9/08* (2013.01); *H02M 5/45* (2013.01)

(58) Field of Classification Search
CPC ........ G01R 31/086; H02H 9/001; H02H 9/08; H02H 9/002; H02M 5/45; H02M 5/451; Y02B 70/10
See application file for complete search history.

(56) References Cited

U.S. PATENT DOCUMENTS 4,146,920 A * 3/1979 Wills ............... H02M 7/517
                                                363/27
4,321,662 A * 3/1982 Yokoyama .......... H02M 7/1555
                                                323/237
(Continued)

OTHER PUBLICATIONS

B.-R. Park, S.-W. Han and H.-Y. Cha, "Diode Bridge Embedded AlGaN/GaN Bidirectional Switch," in IEEE Electron Device Letters, vol. 36, No. 4, pp. 324-326, Apr. 2015, doi: 10.1109/LED. 2015.2398459. (Year: 2015).*

(Continued)

*Primary Examiner* — David E Smith
*Assistant Examiner* — Christopher J Gassen
(74) *Attorney, Agent, or Firm* — Stanek Lemon Crouse Meeks, PA

(57) ABSTRACT

An apparatus includes a mechanical switch and a solid-state switch, such as a diamond switch or antiparallel-connected thyristor pair, coupled in series between an AC source and the load, such as a substation input transformer. The control circuit may be configured to connect the AC power source to the load by closing the mechanical switch and turning on the solid-state switch thereafter. The control circuit may be configured to interrupt a connection of the AC source to the load by turning off the solid-state switch and closing the mechanical switch thereafter. Operations of the switches may be coordinated with a fuse coupled in series with the solid-state switch to address different types of fault conditions.

13 Claims, 6 Drawing Sheets

(51) Int. Cl.
*H02H 9/08* (2006.01)
*H02M 5/45* (2006.01)

(56) References Cited

U.S. PATENT DOCUMENTS

| | | | | |
|---|---|---|---|---|
| 2007/0070557 | A1* | 3/2007 | Maclennan | H03K 17/0412 |
| | | | | 361/18 |
| 2011/0316489 | A1* | 12/2011 | Norimatsu | H02M 1/36 |
| | | | | 320/166 |
| 2015/0194903 | A1* | 7/2015 | Harada | H02M 1/40 |
| | | | | 363/37 |
| 2017/0179721 | A1* | 6/2017 | Wang | H01G 4/258 |
| 2017/0353028 | A1* | 12/2017 | Makino | H02M 3/155 |
| 2018/0076659 | A1* | 3/2018 | Giuntini | H02J 9/062 |
| 2018/0083438 | A1* | 3/2018 | Reed | H05B 47/25 |
| 2020/0106258 | A1* | 4/2020 | Mehraeen | H03K 17/16 |
| 2020/0366079 | A1* | 11/2020 | Telefus | H01H 33/593 |

OTHER PUBLICATIONS

Sokolovs, Alvis & Galkin, Ilya. (2010). Matrix Converter Bi-directional Switch Power Loss and Cooling Condition Estimation for Integrated Drives. Scientific Journal of Riga Technical University. Power and Electrical Engineering. 27. 138-141. 10.2478/v10144-010-0036-9. (Year: 2010).*

Sokolovs, Alvis & Galkin, Ilya. (2010) Matrix Converter B-directional Switch Poer Loss and Cooling Condition Estimation for Integrated Drives, Scientific Journal of Riga Technical University, Power and Electrical Engineering, 27, 138-141, 10.2478/v10144-010-0036-9 (Year: 2010).

\* cited by examiner

HYBRID SWITCH FOR SUBSTATION AND OTHER APPLICATIONS AND METHODS OF OPERATING SAME

CROSS REFERENCE TO RELATED APPLICATION

This application is a continuation of U.S. patent application Ser. No. 17/003,594; filed Aug. 26, 2020, entitled HYBRID SWITCH FOR SUBSTATION AND OTHER APPLICATIONS AND METHODS OF OPERATING SAME which contents are hereby incorporated herein by reference in its entirety.

BACKGROUND

The inventive subject matter relates to electrical power apparatus and methods and, more particularly, to circuit interruption apparatus and methods.

Primary switches for medium-voltage (1 kV-35 kV) substation transformers commonly are mechanical switches of an air, gas-insulated or vacuum type. The mechanisms used to actuate mechanical medium-voltage air type switches generally need to be very robust due to the need to make (close) on a system fault, which can be on the order of 40 kA. Manually closing a mechanical switch in on such a fault may require very high levels of force. Conventional mechanical primary switches may also have significant limitations with regard to fault breaking capability due to their relatively slow operating speeds.

SUMMARY

Some embodiments of the inventive subject matter provide an apparatus including a diamond switch including a diode network having a first node configured to be coupled to an AC source, a second node configured to be coupled to a load. The apparatus further includes a semiconductor switch configured to couple third and fourth nodes of the diode network to one another, a mechanical switch configured to couple the AC power source to the first node of the diode network and a control circuit configured to control the mechanical switch and the semiconductor switch. The control circuit may be configured to connect the AC power source to the load by closing the mechanical switch and turning on the semiconductor switch thereafter. The control circuit may be configured to interrupt a connection of the AC source to the load by turning off the semiconductor switch and closing the mechanical switch thereafter.

In some embodiments, the load may be coupled to the second node by a transformer and the control circuit may be configured to pre-charge the transformer by closing the mechanical switch and modulating the semiconductor switch thereafter. In further embodiments, the control circuit may be configured to close into a fault by closing the mechanical switch and turning on the semiconductor switch thereafter.

In some embodiments, the control circuit may be configured to sense a fault connected to the second node and to responsively turn off the semiconductor switch and open the mechanical switch thereafter. The control circuit may be configured to turn off the semiconductor switch and open the mechanical switch thereafter responsive to detection of an arc flash.

In further embodiments, the apparatus may include a fuse connected in series with the diamond switch. The control circuit may be configured to turn off the semiconductor switch and open the mechanical switch responsive to a first fault condition and to allow the fuse to clear the fault responsive to a second fault condition. The first fault condition may include, for example, an arc flash.

Some embodiments provide an apparatus including a substation including an input transformer, a mechanical switch having a first terminal coupled to an AC power source, a solid-state switch configured to couple a second terminal of the mechanical switch to the input transformer of the substation, and a control circuit configured to control the mechanical switch and the solid-state switch. The solid-state switch may include, for example, a diamond switch or a pair of antiparallel-connected semiconductor switches.

In some embodiments, the control circuit may be configured to connect the AC power source to the input transformer by closing the mechanical switch and turning on the solid-state switch thereafter. In further embodiments, the control circuit may be configured to pre-charge the input transformer by modulating the solid-state switch after closing the mechanical switch. In some embodiments, the control circuit may be configured to close into a fault by closing the mechanical switch and turning on the solid-state switch thereafter.

The apparatus may further include a fuse coupled in series with the solid-state switch. The control circuit may be configured to turn off the solid-state switch and open the mechanical switch responsive to a first fault condition and keep the mechanical switch open and the solid-state switch on to allow the fuse to open responsive to a second fault condition. The control circuit may be configured to detect the first fault condition responsive to detection of an arc flash.

Still further embodiments provide methods including coupling an input transformer of a substation to an AC power source via a solid-state switch and a mechanical switch coupled in series. The methods further include controlling the mechanical switch and the solid-state switch responsive to a state of the substation.

DETAILED DESCRIPTION

Figure 1:
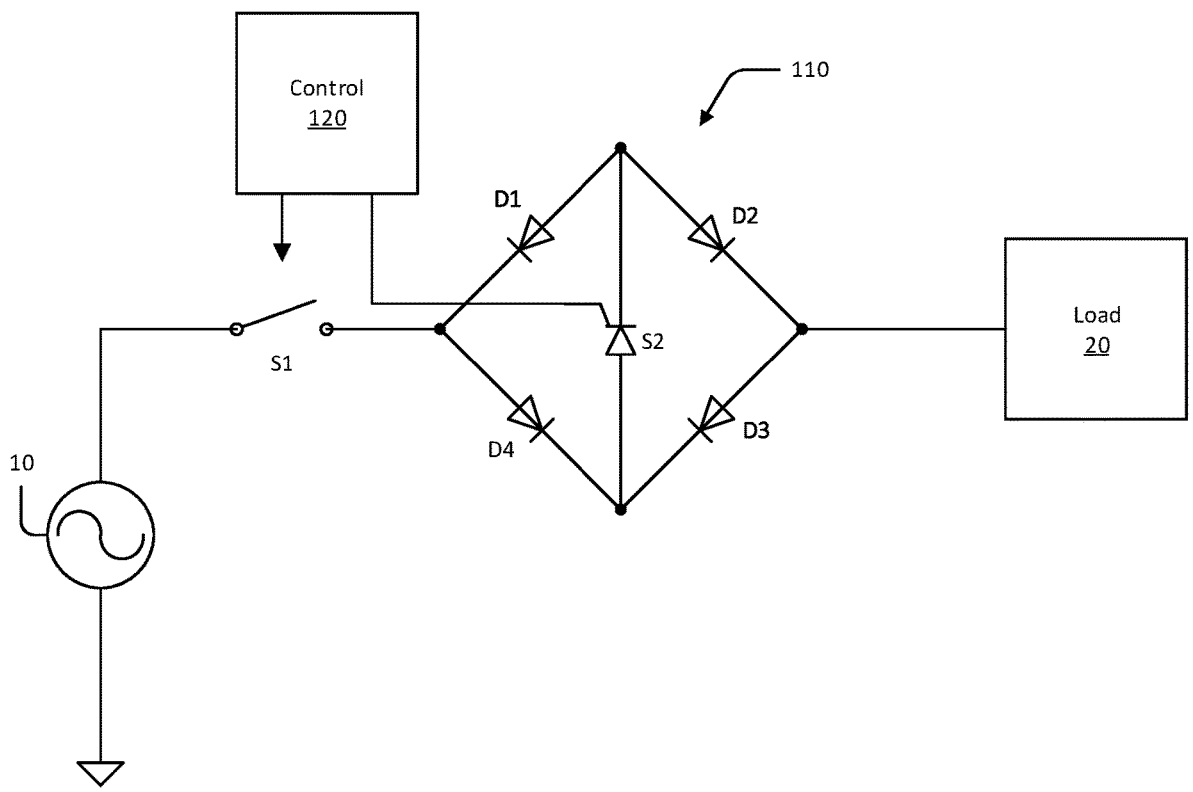
FIG. 1 is a schematic diagram illustrating a hybrid switch apparatus according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Some embodiments of the inventive subject matter arise from a realization that improved substation primary switch performance may be achieved by using a hybrid switch apparatus including, for example, a series configuration of a no-load break switch for the purpose of visual isolation and a "diamond" or other type of solid-state switch that uses power semiconductor switches, such as diodes, thyristors or similar devices, to perform high-speed switching functions. Such a switching approach can have several advantages, including the elimination of the brute force required to close a mechanical switch in on a fault. Current rate of change can be detected relatively quickly and used to trigger the solid-state switch, which can reduce operating forces and extend mechanical life, while providing fast clearing of downstream faults. Such an arrangement can also enable repetitive load breaking that is not available with conventional air switches. The use of the solid-state switch also enables soft pre-charging for substation transformers through modulation of the solid-state switch.

FIG. 1 illustrates a hybrid switch apparatus according to some embodiments. The apparatus includes a mechanical switch S1 having a first terminal configured to be coupled to an AC power source 10. The apparatus further includes a solid-state switch in the form of a diamond switch 110 including a diode network circuit including diodes D1, D2, D3, D4. A first node of the diode network is coupled to a second terminal of the mechanical switch S1. A second node of the diode network is configured to be coupled to a load 20. The diamond switch 110 further includes a semiconductor switch, e.g., an integrated gate commutated thyristor (IGCT) S2, coupled between third and fourth nodes of the diode network. A control circuit 120 is configured to control the mechanical switch S1 and the semiconductor switch S2.

Figure 2:
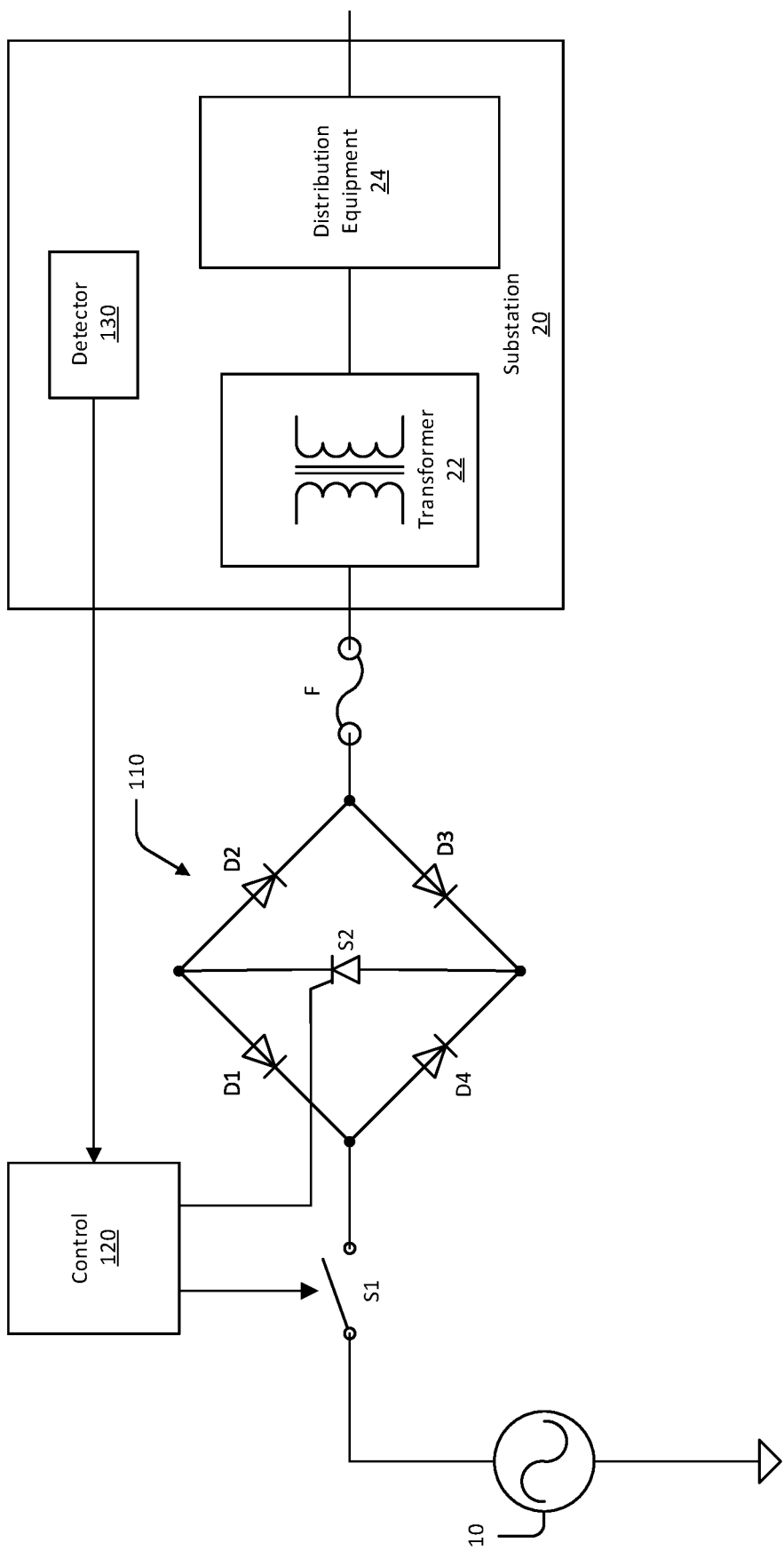
FIG. 2 is a schematic diagram illustrating application of the hybrid switch apparatus as primary switch for a medium-voltage substation according to some embodiments.

FIG. 2 illustrates an application of the hybrid switch apparatus of FIG. 2 as a primary switch for a substation 20. An output of the diamond switch 110 is coupled to a primary side of an input transformer 22 of the substation 20. As shown, a fuse F couples the output of the diamond switch 110 to the input transformer 22 but, in some embodiments, the fuse F may be otherwise connected in series with the diamond switch 110, for example, between the mechanical switch S1 and the diamond switch 110. A secondary side of the transformer 22 is coupled to distribution equipment 24, e.g., main circuit breakers, branch circuit breakers and the like. The hybrid switch apparatus may be used to effect multiple operations, including energizing and de-energizing the distribution equipment 24, pre-charging the transformer 22 and interrupting power to the substation 20 in response to a fault downstream of the hybrid switch apparatus, such as a fault in the distribution equipment 24.

The control circuit 120 may operate the mechanical switch S1 and the diamond switch 110 responsive to a state of the substation 20, such as current, voltage or other electrical parameters of the transformer 22 and distribution equipment 24 as detected by a detector circuit 130. The detector circuit 130 may include, for example, circuitry that senses current, voltage and/or other parameters of equipment in the substation 20. The detector circuit 130 may, for example, sense current in one or more conductors in the substation 20. The control circuit 120 may turn off the semiconductor switch S2 (and, thus, the diamond switch 110) when a rate of change of the detected current meets a certain criterion (e.g., exceeds a predetermined rate of change threshold), followed by opening the mechanical switch S1 to provide galvanic isolation.

In some embodiments, the detector circuit 130 may include, for example, detection circuitry that is suited for detection of current, light heat and/or other parameters associated with arc flash events occurring in the substation 20, such as arc flash detection circuitry along the lines of that described in U.S. Pat. No. 10,523,000 to Shea et al, incorporated herein by reference in its entirety. Responsive to detection of certain states of these parameters, the control circuit 120 may operate the diamond switch 110 to break the fault, followed by opening the mechanical switch S1 to assure galvanic isolation.

Figure 3:
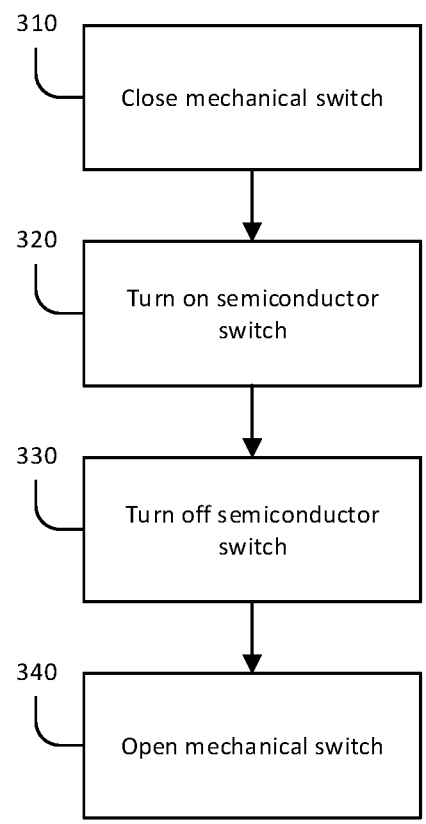
FIGS. 3-5 are flowcharts illustrating operations of hybrid switch apparatus according to further embodiments.
Figure 4:
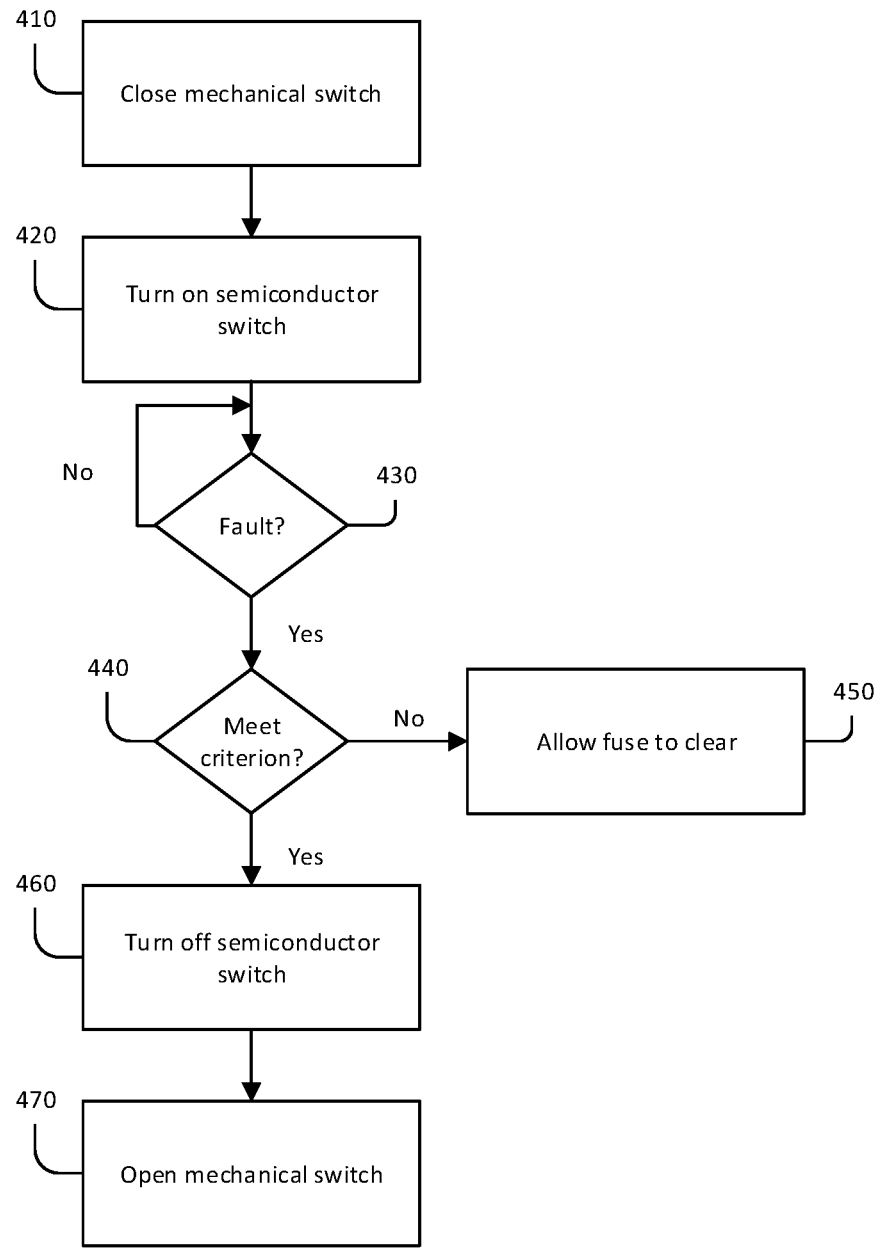
Figure 5:
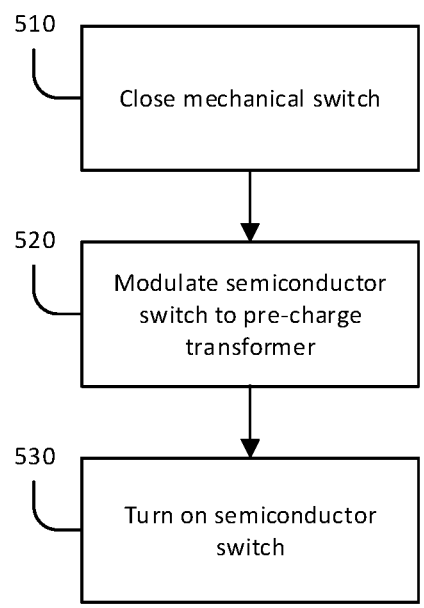

FIGS. 3-5 illustrate various operations that may be performed using the hybrid switch apparatus of FIG. 2. Referring to FIGS. 2 and 3, to energize the substation 20, the mechanical switch S1 may be first closed (block 310), followed by turning on the semiconductor switch S2 (block 320) to energize the substation 20. A reverse process may be used to de-energize the substation 20, wherein the semiconductor switch S2 is first turned on (block 330), followed by opening the mechanical switch S1. The operations illustrated in FIG. 3 may also be used to make into a fault downstream of the hybrid switch and subsequently break the fault.

According to further aspects, the hybrid switch apparatus and the fuse F may be used to selectively respond to different types of faults. Referring to FIGS. 2 and 4, the substation 20 may be energized by closing the mechanical switch S1 and then turning on the semiconductor switch S2 of the diamond switch 110 (blocks 410, 420). If a fault is subsequently detected that meets a predetermined criterion, the semiconductor switch S2 is turned off, followed by opening the mechanical switch S2 (blocks 430, 440, 470, 480).

In some embodiments, such a fault condition may be, for example, a fault condition present when the substation 20 is first energized. After closing the mechanical switch S1, the semiconductor switch S2 can be turned on momentarily (pulsed) while monitoring current passing through the diamond switch 110. If a rapid rise in current is detected (e.g., a high value of di/dt), the semiconductor switch S2 can be turned off and kept off to reduce or prevent damage. If a rapid increase in current is not detected, the semiconductor switch S2 can be turned on again to allow energization of the substation 20 to proceed, which may include modulating the semiconductor switch S2 to pre-charge the substation transformer and then leaving the semiconductor switch S2 continuously on to fully energize the substation 20, as discussed below.

In some embodiments, other fault conditions might be the presence of a fault that occurs after the substation 20 has been energized and cannot be properly and reliably cleared by the fuse F. Such a fault may be, for example, a short circuit within the substation 20 that causes an arc flash that can endanger personnel and/or equipment. As noted above, such a fault condition may be detected, for example, by the detector circuit 130 detecting a light flash and/or other associated circuit parameters (e.g., certain current characteristics) that indicate an arc flash event.

After energization of the substation 20, a different type of fault condition may occur, such as a sustained overload. In the presence of such a fault condition, the mechanical switch S1 and the semiconductor switch S2 may remain on, allowing the fuse F to clear the fault (blocks 430, 440, 450).

As noted above, according to further embodiments, a hybrid switch apparatus along the lines described above can also be used to pre-charge the substation transformer 22, which can reduce inrush currents when the substation 22 is fully energized. Referring to FIGS. 2 and 5, before pre-charging, the mechanical switch S1 is closed (block 510). The semiconductor switch S2 may then be modulated (intermittently turned on) to provide a controlled current to pre-charge the substation transformer 22 (block 320). In some embodiments, the control circuit 120 may modulate the semiconductor switch S2 responsive to parameters sensed by the detector circuit 130 until the control circuit 120 determines that the transformer 22 is adequately pre-charged. In some embodiments, the control circuit 120 may simply modulate the semiconductor switch S2 in a predetermined pattern for a duration that provides an adequate pre-charge of the transformer 22. After the transformer 22 has been pre-charged, the semiconductor switch S2 may be continuously turned on to fully energize the substation 20 (block 530).

Figure 6:
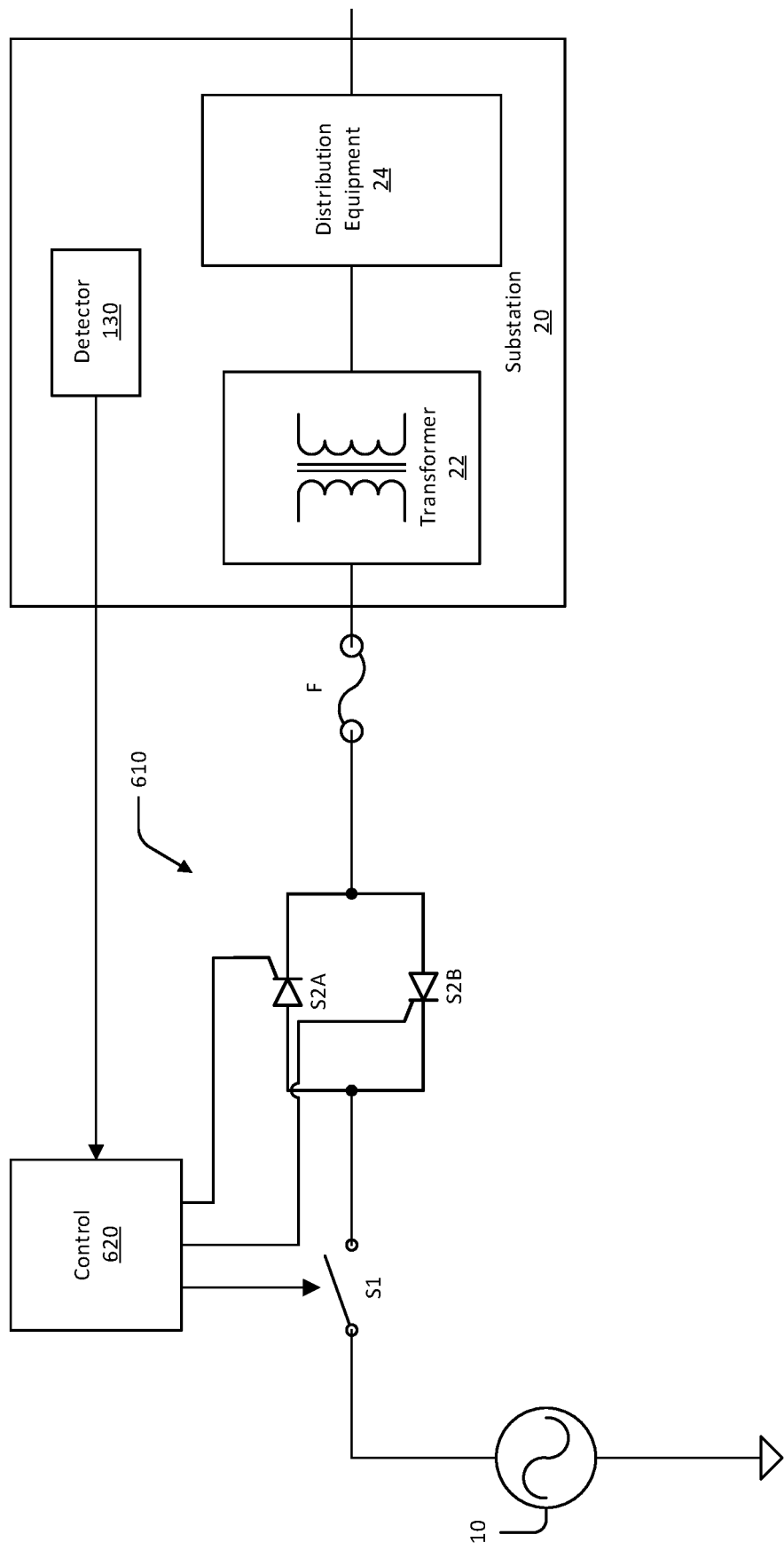
FIG. 6 is a schematic diagram illustrating application of the hybrid switch apparatus as primary switch for a medium-voltage substation according to further embodiments

In further embodiments, a semiconductor switch arrangement other than the diamond switch arrangement illustrated in FIG. 2 may be used to similar effect. For example, FIG. 6 shows a hybrid switch apparatus that includes a mechanical switch S1 having a first terminal configured to be coupled to an AC power source 10. A solid-state switch 610 includes antiparallel-connected thyristors S2A, S2B and is coupled between the mechanical switch S1 and a primary side of an input transformer 22 of a substation 20. A fuse F is connected in series with the solid-state switch 610, here shown connected between the primary switch S1 and the input transformer 22. A secondary side of the transformer 22 is coupled to distribution equipment 24 of the substation 20, e.g., main circuit breakers, branch circuit breakers and the like, along the lines discussed above with reference to FIG. 2.

The control circuit 620 may operate the mechanical switch S1 and the solid-state switch 610 responsive to a state of the substation 20, such as current, voltage or other electrical parameters of the transformer 22 and distribution equipment 24 as detected by a detector circuit 130. The detector circuit 130 may include, for example, circuitry that senses current, voltage and/or other parameters of equipment in the substation 20. Along the lines discussed above with reference to FIG. 2, the detector circuit 130 may include, for example, detection circuitry that is suited for detection of current, light heat and/or other parameters associated with an arc flash occurring in the substation 20 and, responsive to detection of certain states of these parameters, the control circuit 620 may operate the solid-state switch 610 to break a fault causing the arc flash, followed by opening the mechanical switch S1 to assure galvanic isolation. It will be appreciated that the arrangement shown in FIG. 6 may be used to perform operations along the lines of those discussed above with reference to FIGS. 3-5.

The drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
a mechanical switch and a semiconductor switch configured to couple an AC power source to a primary side of a transformer; and
a control circuit configured to control the mechanical switch and the semiconductor switch, wherein the control circuit is configured to intermittently turn on the semiconductor switch to provide a controlled current that pre-charges the transformer before continuously connecting the AC power source to the primary side of the transformer.

2. The apparatus of claim 1, wherein the control circuit is configured to interrupt a connection of the AC power source to a load by turning off the semiconductor switch and opening the mechanical switch thereafter.

3. The apparatus of claim 1, wherein the control circuit is configured to close into a fault by closing the mechanical switch and turning on the semiconductor switch thereafter.

4. The apparatus of claim 1, wherein the control circuit is configured to sense a fault and to responsively turn off the semiconductor switch and open the mechanical switch thereafter.

5. The apparatus of claim 4, wherein the control circuit is configured to turn off the semiconductor switch and open the mechanical switch thereafter responsive to detection of an arc flash.

6. An apparatus comprising:
a mechanical switch and a semiconductor switch configured to couple an AC power source to a primary side of a transformer; and
a control circuit configured to control the mechanical switch and the semiconductor switch, wherein the control circuit is configured to turn off the semiconductor switch and open the mechanical switch responsive to a first fault condition and to maintain the semiconductor switch in an on state to allow a fuse connected in series with the semiconductor switch to clear a second fault condition responsive to the second fault condition.

7. The apparatus of claim 6, wherein the first fault condition comprises an arc flash and wherein the second fault condition comprises an overload.

8. An apparatus comprising:
a substation comprising an input transformer having a primary side and a secondary side and distribution equipment connected to the secondary side of the input transformer;
a mechanical switch and a semiconductor switch configured to couple an AC power source to the primary side of the input transformer; and
a control circuit configured to control the mechanical switch and the semiconductor switch, wherein the control circuit is configured to intermittently turn on the semiconductor switch to provide a controlled current that pre-charges the input transformer before continuously connecting the AC power source to the primary side of the input transformer.

9. The apparatus of claim 8, wherein the semiconductor switch comprises a diamond switch or a pair of antiparallel-connected semiconductor switches.

10. The apparatus of claim 8, wherein the control circuit is configured to close into a fault by closing the mechanical switch and turning on the semiconductor switch thereafter.

11. The apparatus of claim 8, further comprising a fuse coupled in series with the semiconductor switch.

12. The apparatus of claim 11, wherein the control circuit is configured to turn off the semiconductor switch and open the mechanical switch responsive to a first fault condition and to maintain the semiconductor switch in an on state and the mechanical switch in a closed state to allow the fuse to open responsive to a second fault condition.

13. The apparatus of claim 12, wherein the control circuit is configured to detect the first fault condition responsive to detection of an arc flash.

* * * * *